(12) United States Patent
Choi et al.

(10) Patent No.: US 7,604,917 B2
(45) Date of Patent: Oct. 20, 2009

(54) POLYMER, TOP COATING LAYER, TOP COATING COMPOSITION AND IMMERSION LITHOGRAPHY PROCESS USING THE SAME

(75) Inventors: Sang-Jun Choi, Seoul (KR); Han-Ku Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 11/546,423

(22) Filed: Oct. 12, 2006

(65) Prior Publication Data

US 2007/0082297 A1    Apr. 12, 2007

(30) Foreign Application Priority Data

Oct. 12, 2005    (KR) .................. 10-2005-0096077

(51) Int. Cl.
*G03F 7/11*    (2006.01)
*G03F 7/20*    (2006.01)
*G03F 7/30*    (2006.01)
*G03F 7/38*    (2006.01)

(52) U.S. Cl. .............. 430/270.1; 430/272.1; 430/273.1; 430/325; 430/326; 430/330; 526/279

(58) Field of Classification Search ........................ None
See application file for complete search history.

(56) References Cited

U.S. PATENT DOCUMENTS

2004/0053162 A1*    3/2004    Uenishi et al. ........... 430/270.1
2006/0166128 A1*    7/2006    Gogolides et al. ........ 430/270.1

FOREIGN PATENT DOCUMENTS

| JP | 2004-277401 | 10/2004 |
|---|---|---|
| JP | 2005-099648 | 4/2005 |
| JP | 2005-109146 | 4/2005 |
| JP | 2005-150450 | 6/2005 |
| KR | 10-2004-0061564 A | 7/2004 |
| KR | 1020050031957 A | 4/2005 |

OTHER PUBLICATIONS

Tegou et al ("Polyhedral Oligomeric Silsesquioxane (POSS) Based Resists: Material Design Challenges and Lithographic Evaluation at 157 nm", Chemistry of Materials, vol. 16, pp. 2567-2577 (2004)).*
Gao et al "Evaluation of Neat Resins Based on Methacrylates Modified with Methacryl-POSS, as Potential Organic-Inorganic Hybrids for Formulating Dental Restoratives", Polymers for Advanced Technologies, vol. 12, p. 355-360 (2001).*
Korean Office Action dated Oct. 24, 2006 for counterpart Korean Application No. 10-2005-0096077 with English Translation.

* cited by examiner

*Primary Examiner*—Sin J. Lee
(74) *Attorney, Agent, or Firm*—Harness, Dickey & Pierce, P.L.C.

(57) ABSTRACT

A polymer, a top coating layer, a top coating composition and an immersion lithography process using the same are provided. The polymer used as a top coating layer covering (or formed on) a photoresist may include a specific chemical structure. The top coating composition may include a solvent and a polymer of having the specific chemical structure. The immersion lithography process includes forming a photoresist layer on a wafer, forming a top coating layer on the photoresist layer, immersing the wafer in water, performing an exposure process on the photoresist layer and forming a photoresist pattern by removing the top coating layer and the photoresist layer with a developer.

15 Claims, 2 Drawing Sheets

POLYMER, TOP COATING LAYER, TOP COATING COMPOSITION AND IMMERSION LITHOGRAPHY PROCESS USING THE SAME

PRIORITY STATEMENT

This application claims the benefit of priority under 35 U.S.C. §119 from Korean Patent Application No. 10-2005-0096077, filed on Oct. 12, 2005 in the Korean Intellectual Property Office, the disclosure of which is incorporated herein by reference in its entirety.

BACKGROUND OF THE INVENTION

1. Field of the Invention

Example embodiments relate to a semiconductor and a semiconductor manufacturing method. Other example embodiments relate to a polymer, a top coating layer, a top coating composition and an immersion lithography process using the same.

2. Description of the Related Art

Because semiconductor devices are becoming more highly integrated, more delicate and accurate patterning may be necessary or desired. The width of a photoresist pattern available in an exposure process may be determined according to Rayleigh's equation, $R=(k1)(\lambda/NA)$ wherein R represents resolution, k1 represents a process constant, $\lambda$ represents a wavelength of a light source and NA (numerical aperture) represents an effective aperture of a lens. To reduce the resolution, the process constant (k1) may be smaller, the wavelength of a light source ($\lambda$) may be shorter and/or the effective aperture of a lens may be increased.

To generate a light source having a wavelength shorter than the wavelength of KrF (248 mm) or ArF (193 mm) as used in the related art, an exposure process using an extreme ultraviolet (EUV) as a light source having a wavelength of 13.4 nm may be necessary. The exposure process using the EUV as the light source may require a vacuum condition and a reflective photomask, which may be different from the vacuum condition and the reflective photomask used in the related art processes. The exposure equipment necessary to use the EUV as the light source may be costly, making use of the exposure equipment for the exposure process an undesirable option.

The effective aperture of a lens (NA) may be proportional to $n \sin \theta$ wherein n represents a refractive index of a medium between a lens and a photoresist. Because n represents the refractive index of the medium between the lens and photoresist, resolution increases as the refractive index of the medium increases.

In an immersion lithography process exploiting the relationship between the resolution and the refractive index, an exposure process may be performed to increase resolution through a medium (having a refractive index higher than the refractive index of air) and an ArF light source used in the related art. Water, which has a refractive index of 1.4, has a refractive index higher than air, which has a refractive index of 1. As such, water may be used as the medium.

If the exposure process is performed using water as the medium, then a photosensitive polymer, a photoacid generator and a solvent may be dissolved into the water. If the exposure process is performed using water as the medium, then bubbles may form on a boundary between the water and a photoresist layer. Because of the solubility of the solvent in the water and/or the formation of the bubbles, it may be difficult to form a photoresist pattern with improved accuracy.

Because of the solubility of the solvent in the water and/or the formation of the bubbles, a top coating layer may be necessary. The top coating layer may protect a photoresist layer from the water. The top coating layer may have a hydrophobicity (e.g., lacking affinity for water) and a light transmitting property. The top coating layer may be more easily removed in a developer. The use of fluoropolymer materials in a top coating layer has been acknowledged in the related art. The fluoropolymer materials may be costly and more difficult to manufacture. As such, the fluoropolymer materials may not be easily commercialized.

SUMMARY OF THE INVENTION

Example embodiments relate to a semiconductor and a semiconductor manufacturing method. Other example embodiments relate to a polymer, a top coating layer, a top coating composition and an immersion lithography process using the same.

Example embodiments provide a polymer having an increased hydrophobicity and/or developer solubility. The polymer may be used as a top coating layer. The top coating layer may also have a higher commercial value and/or involve easier manufacture processes.

Example embodiments also provide a top coating composition having the polymer and a solvent. Other example embodiments provide an immersion lithography process wherein a more delicate and/or more accurate patterning is achieved.

Example embodiments provide a polymer used as a top coating layer covering (or formed on) a photoresist in an immersion lithography process, the polymer having Chemical Structure (1).

CHEMICAL STRUCTURE (1)

wherein $R_1$ represents a hydrogen or a methyl group; $R_2$ represents at least one selected from the group consisting of a hydrogen, an alkyl group, an alkenyl group, an alkoxy group and an aryl group; Y represents a space group having 2 to 6 carbons; Z represents an ethylene monomer having at least one of a hydroxy group and a carboxyl group; and the expressions $m/(m+n)=0.1$ to 0.7 and $n/(m+n)=0.3$ to 0.9 are satisfied. A mass average molecular weight of the polymer is 5,000 to 100,000.

In example embodiments, $R_2$, Y and Z represent a cyclopentyl group, a propyl group and methacrylic acid, respectively.

In other example embodiments, $R_2$, Y and Z represent an isobutyl group, a propyl group and methacrylic acid, respectively.

In yet other embodiments, $R_2$, Y and Z represent a cyclopentyl group, a propyl group and 2-hydroxyethyl methacrylic acid, respectively.

In still other embodiments, $R_2$, Y and Z represent a cyclopentyl group, a propyl group and methacrylic acid, respectively, and the polymer includes a comonomer formed of 2-hydroxyethyl methacrylic acid.

In example embodiments, the polymer used as a top coating layer and having the Chemical Structure (1) (hereinafter 'the polymer') may include polyhedral oligomeric silsesquioxane (POSS) molecules (e.g., cage-like and bulky silicon molecules). Because the POSS molecules (or POSS derivatives) are more readily commercialized, the polymer of the POSS molecules may be easier to synthesize compared to the synthesis of a fluoropolymer material. The polymer of the POSS molecules (or the POSS derivatives) may be cheaper to manufacture (or produce).

In yet other embodiments, the space group (Y) functions as a flexible chain in the polymer, reduces rigidity in a backbone of the polymer and decreases a glass transition temperature (Tg). The bulky POSS molecules (or the POSS derivatives), which have a higher hydrophobicity, may move more freely in a polymer matrix due to the space group (Y). As such, the hyrdrophobicity of the polymer may increase. The polymer of the POSS molecules (or the POSS derivatives) may not easily mix with the photoresist layer and water. If the polymer is used as the top coating layer, then the top coating layer may not mix with the photoresist layer and protects the photoresist layer from water.

In other example embodiments, the polymer includes an ethylene monomer having at least one of the hydroxy group and the carboxyl group. The polymer may be a comonomer copolymerized with a monomer having the POSS molecules (or the POSS derivatives). Because of a hydroxy group and a carboxyl group in the ethylene monomer, the polymer may be more easily dissolved in a developer.

In further example embodiments, a top coating composition covering (or formed on) a photoresist in an immersion lithography process includes a solvent and the polymer. The top coating composition may be a solution (e.g., a top coating solution composition). A percentage of solution by mass (mass %) of the polymer may be 1% to 10% of a total weight of the composition.

In other example embodiments, the solvent may not dissolve a polymer material in the photoresist layer but may dissolve the polymer having the Chemical Structure (1). The hydrophobicity of the solvent may increase. The solvent may also have 4 to 12 carbons. The solvent may be at least one selected from the group consisting of 4-methyl-2-pentanol, isobutanol, isooctanol and decane. The solvent may be a mixed solution of aliphatic hydrocarbon having 6 to 12 carbons and an alcohol-series solution to increase hydrophobicity. The solvent may be a mixed solution including 95% of decane and 5% of the alcohol-series solution. In other example embodiments, an immersion lithography process in provide that includes forming a photoresist layer on a wafer, forming a top coating layer on the photoresist layer, immersing the wafer in water, performing an exposure process on the photoresist layer and forming a photoresist pattern by removing the top coating layer and the photoresist layer with a developer. The top coating layer may include the polymer.

In other example embodiments, forming of the top coating layer includes coating the photoresist layer with a top coating composition including the polymer dissolved in a solvent, and performing a baking process on the resulting structure. The solvent may include 4 to 12 carbons. The polymer may have a percentage of solution by mass of 1% to 10% of a total weight of the composition.

BRIEF DESCRIPTION OF THE DRAWINGS

The accompanying drawings, which are included to provide a further understanding of the example embodiments and are incorporated in and constitute a part of this application. FIGS. 1-6 illustrate example embodiments and together with the description function to explain the principle of the invention.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between,'" "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a semiconductor and a semiconductor manufacturing method. Other example embodiments relate to a polymer, a top coating layer, a top coating composition and an immersion lithography process using the same.

FIGS. 1 to 6 are diagrams illustrating cross-sectional views of an immersion lithography process according to example embodiments.

Figure 1:
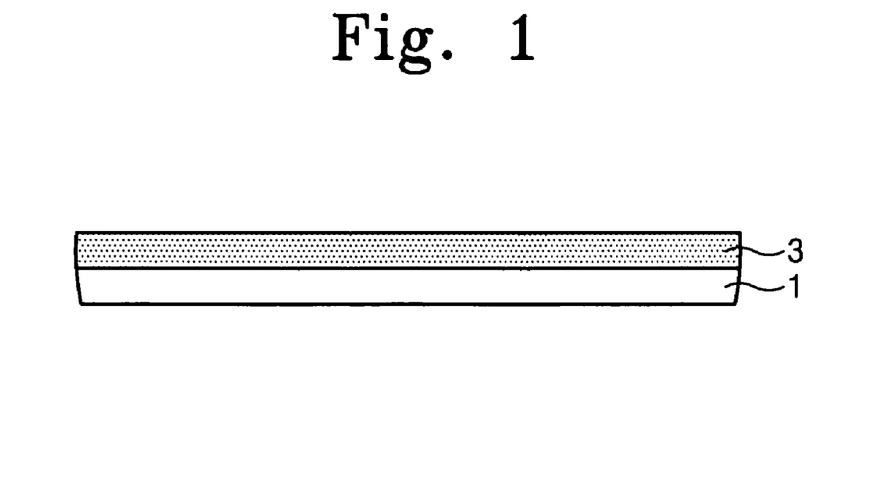
FIGS. 1 to 6 are diagrams illustrating cross-sectional views of an immersion lithography process according to example embodiments.

Referring to FIG. 1, an anti-reflection layer (not shown) may be formed on a wafer 1. A photoresist layer 3 may be formed on the anti-reflection layer. The photoresist layer 3 may be formed by performing any coating process and baking process known in the art.

Figure 2:
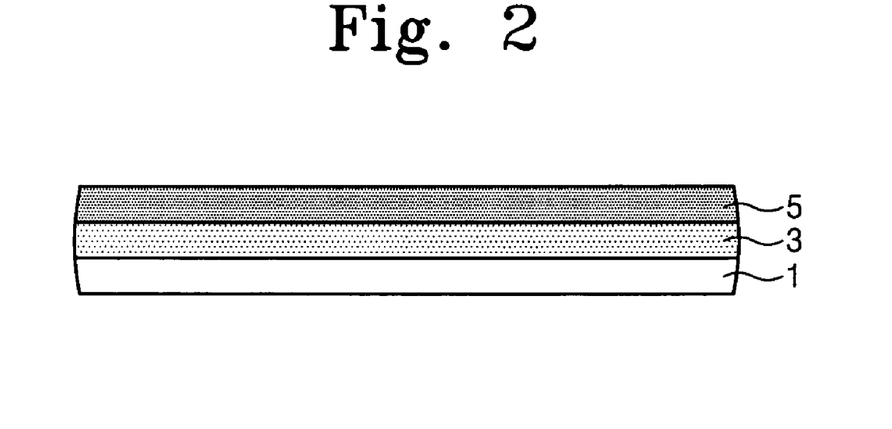

Referring to FIG. 2, a top coating composition 5 may be coated on the photoresist layer 3. The top coating composition 5 may be formed including a polymer having Chemical Structure (1) (shown below) (hereinafter 'the polymer') and a solvent having 4 to 12 carbons.

CHEMICAL STRUCTURE (1)

wherein $R_1$ represents a hydrogen or a methyl group; $R_2$ represents at least one selected from the group consisting of a hydrogen, an alkyl group, an alkenyl group, an alkoxy group, and an aryl group; Y represents a space group having 2 to 6 carbons; Z represents an ethylene monomer having at least one of a hydroxy group and a carboxyl group; and the expressions $m/(m+n)=0.1$ to 0.7 and $n/(m+n)=0.3$ to 0.9 are satisfied. The polymer may have a mass average molecular weight of 5,000 to 100,000.

A percentage of solution by mass of the polymer may be 3% to 5weight of the composition. The solvent may be at least one selected from the group consisting of 4-methyl-2-pentanol, isobutanol, isooctanol and decane. The solvent may be a mixed solution including an aliphatic hydrocarbon having 6 to 12 carbons and an alcohol-series solution to increase hydrophobicity. The solvent may be a mixed solution including 95% of decane and 5% of the alcohol-series solution. The alcohol-series solution may be one selected from the group consisting of 4-methyl-2-pentanol, isobutene and isooctanol.

The polymer, which may be used for a top coating layer, may include polyhedral oligomeric silsesquioxane (POSS) molecules (e.g., cage-like and bulky silicon molecules) or derivatives thereof. The POSS molecules (or the POSS derivatives) may provide a rigid "backbone" of inorganic material within an organic molecular structure of the polymer, separating organic components and/or creating a small hole in an organic portion of the polymer.

Because the POSS molecules (or the POSS derivatives) may be commercialized, the polymer of the POSS molecules (or the POSS derivatives) may be easier to synthesize compared to synthesizing a fluoropolymer material. The polymer of the POSS molecules (or the POSS derivatives) may be cheaper to produce (or manufacture).

Figure 3:
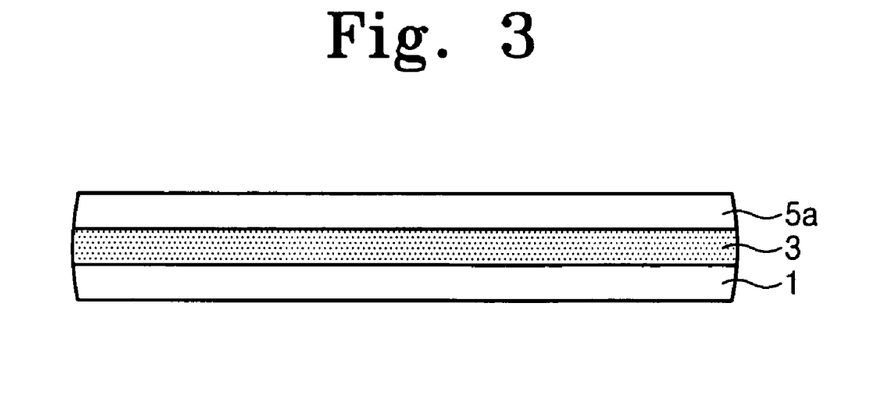

Referring to FIG. 3, a top coating layer 5a may be formed by performing a baking process on the wafer 1 having the top coating composition 5 thereon. A large amount of the solvent in the top coating composition 5 may be evaporated, the top coating layer 5a remaining on the photoresist layer 3 may include primarily the polymer.

Figure 4:
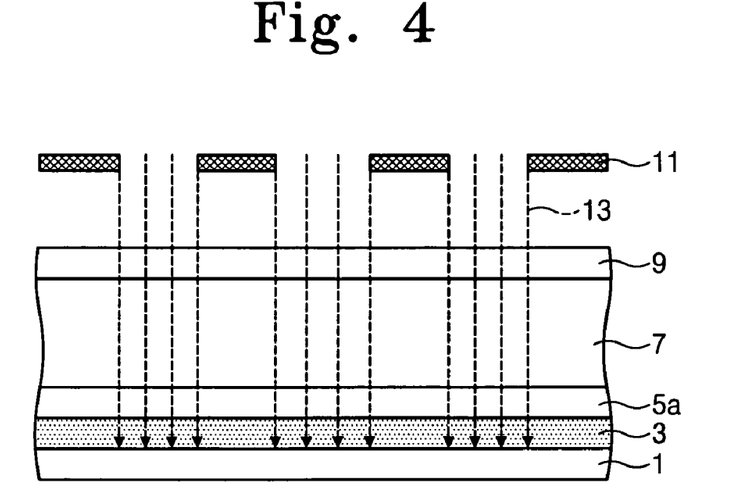
Figure 5:
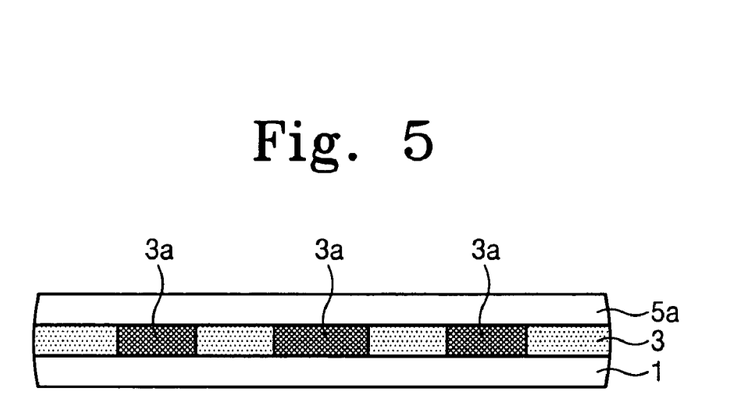

Referring to FIGS. 4 and 5, the wafer 1 having the top coating layer 5a thereon may be immersed in water 7. Because the POSS molecules (or the POSS derivatives) have a stronger hydrophobicity, the polymer may not be mixed with the photoresist layer 3 and the water 7. If the polymer is used for the top coating layer 5a, then the polymer may not be mixed with the photoresist layer 3. The polymer may protect the photoresist layer 3 from the water 7. An exposure process may be performed using light 13 that passes through a photomask 11 and a lens 9. A hardening reaction may occur in an exposed portion of the photoresist 3 due to the light 13. No (or minimal) reaction occurs in the top coating layer 5a.

Figure 6:
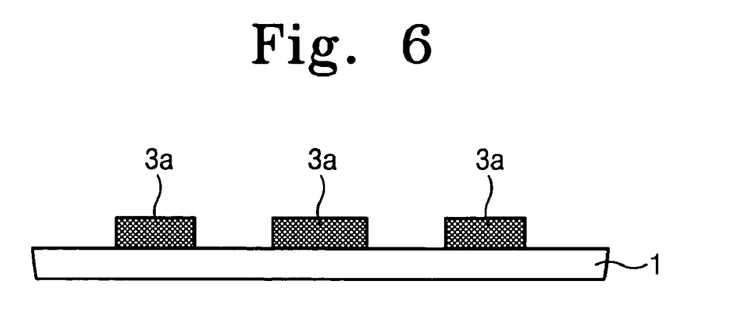

Referring to FIG. 6, a photoresist pattern 3a may be formed by removing the top coating layer 5a and the unexposed photoresist layer 3 using a developer (not shown), after the exposure process. A comonomer in the polymer may include at least one selected from the group including a hydroxy group and a carboxyl group. The top coating layer 5a and the unexposed photoresist 3 may be more easily dissolved in the developer.

Now several examples of the synthesis of polymers having the Chemical Structure (1) will be described.

SYNTHESIS EXAMPLE 1

Referring to Reaction Scheme (1) (shown below), 5 mmol of propylmethacryl-heptacyclopentyl-POSS (I), 15 mmol of methacrylic acid (II) and 4 mol % of azobisisobutyronitrile (AIBN) are dissolved in a tetrahydrofuran (THF) anhydrous solvent in a round bottom flask. The amount of THF solvent corresponds to four times the total weight of monomer (I) and comonomer (II).

REACTION SCHEME (1)

(I)

(II)

(III)

After performing a degassing process using nitrogen gas, the resulting compound is polymerized at a temperature of 65° C. for twelve hours. After the polymerization, the reactant is slowly deposited in an excessive n-hexane solution. A deposit generated is filtered. The deposit is re-dissolved in a desired amount of THF solvent, and deposited in the n-hexane solution. The deposit is dried in under vacuum at a temperature of 50° C. for twenty-four (24) hours.

The resulting polymer is {poly[(propylmethacryl-POSS)-co-(methacrylic acid)]} (III) The approximate yield is 75%. Polymer (III) has a mass average molecular weight of 14,500 and a dispersity (which is a mass average molecular weight/a number average molecular weight) of 1.8. In polymer (III), $R_1$ and $R_2$ represent a methyl group and a cyclopentyl group, respectively; Y represents a propyl group and Z represents a methacrylic acid.

SYNTHESIS EXAMPLE 2

Referring to Reaction Scheme (2) (shown below), 5 mmol of propylmethacryl-heptacyclopentyl-POSS (I), 45 mmol of 2-hydroxyethyl methacrylate (IV) and 4 mol % of AIBN are dissolved in a THF anhydrous solvent in a round bottom flask. The amount of THF solvent corresponds to four times of the total weight of monomer (I) and comonomer (IV).

REACTION SCHEME (2)

(I)

(V)

Processes similar to those process described in the Synthesis Example 1 are performed. The resulting polymer is {poly[(propylmethacryl-POSS)-co-hydroxyethyl methacrylate]} (V). The approximate yield is 70%. Polymer (V) has a mass average molecular weight of 13,300 and a dispersity of 1.9. In polymer (V), $R_1$ and $R_2$ represent a methyl group and a cyclopentyl group, respectively; Y represents a propyl group and Z represents 2-hydroxyethyl methacrylate.

SYNTHESIS EXAMPLE 3

Referring to Reaction Scheme (3), 5 mmol of propylmethacryl-heptacyclopentyl-POSS (I), 20 mmol of 2-hydroxyethyl methacrylate (IV), 10 mmol of methacrylic acid (II) and 4 mol % of AIBN are dissolved in a THF anhydrous solvent in a round bottom flask. The amount of THF solvent corresponds to four times of the total weight of monomers (I), (II) and (IV).

REACTION SCHEME (3)

(I)

Processes similar to those processes described in the Synthesis Example 1 are performed. The resulting polymer is {poly[(propylmethacryl-POSS)-co-hydroxyethyl methacrylate-co-(methacrylic acid)]} (VI). The approximate yield is 70%. Polymer (VI) has a mass average molecular weight of 15,100 and a dispersity of 1.9. In polymer (VI), $R_1$ and $R_2$ represent a methyl group and a cyclopentyl group, respectively; Y represents a propyl group; and Z represents methacrylic acid and 2-hydroxyethyl methacrylate.

A top coating composition may be formed using any of the polymers in the Synthesis Examples 1 to 3.

Example embodiments for forming a pattern using the top coating composition will now be described in more detail. The top coating composition may be a solution (e.g., a top coating solution composition).

According to example embodiments, a top coating composition may be formed by dissolving 1 g of polymer (III) in Synthesis Example 1 in 50 g of isobutanol. The top coating composition may be filtered using a 0.2 µm membrane filter to remove a delicate particle in the top coating composition.

An anti-reflection layer having a thickness of 290 Å (e.g., Rohm-Hass Model No. AR46) may be coated on a bare Si-wafer. A photoresist having a thickness of 180 nm (e.g., ShinEstu Model No. RHR3640), which is used as an ArF light source, may be coated on the bare Si-wafer. A photoresist layer may be formed by performing a pre-baking process on the resulting structure at a temperature of 110° C. for 60 seconds.

A top coating composition, which has a thickness of 400 Å and includes the polymer (III) and isobutanol, may be coated on the photoresist layer. A top coating layer may be formed by performing a baking process on the resulting structure at temperature of 100° C. for 60 seconds. The isobutanol may be evaporated by the baking process, leaving the top coating layer formed primarily of the polymer (III).

A deionized water rinse process may be performed on the wafer having the top coating layer thereon to immerse a surface of the top coating layer. The wafer may be exposed to light using an ArF scanner. A hardening reaction may occur in the exposed photoresist layer, but no reaction may occur in the top coating layer.

The deionized water rinse process may be performed again on the exposed wafer. A post-exposure bake process may be performed at a temperature of 110° C. for 60 seconds. The resulting structure may be developed in a solution containing 2.38 mass % of tetramethyl ammonium hydroxide (TMAH) for 60 seconds. The top coating layer may be removed. A clean 90 nm L/S photoresist pattern may be formed with a dose of 24 mJ/cm$^2$.

According to other example embodiments, a top coating composition may be formed by dissolving 1 g of polymer (V) in Synthesis Example 2 in 50 g of 4-methyl-2-pentanol. The top coating composition may be filtered using a 0.2 µm membrane filter. A top coating layer may be formed using the same processes as described above. The top coating layer may be immersed in water through a deionized water rinse process. After performing exposing and developing processes similar to those described above, a clean 90 nm L/S photoresist pattern may be formed having a dose of 24 mJ/cm$^2$.

In yet other example embodiments, a top coating composition may be formed by dissolving 1 g of polymer (VI) in Synthesis Example 3 in 50 g of 4-methyl-2-pentanol. The top coating composition may be filtered using a 0.2 µm membrane filter. A top coating layer may be formed using similar processes as described above. The top coating layer may be immersed in water through a deionized water rinse process. After performing exposing and developing processes similar to those described above, a clean 90 nm L/S photoresist pattern may be formed having a dose of 24 mJ/cm$^2$.

Referring to the example embodiments described, although an actual immersion lithography equipment is not used, the top coating layer may be immersed in water through the deionized rinse process. The exposure process is performed to make conditions identical (or similar) to the conditions of the immersion lithography process. An equivalent (or increased) degree of effectiveness may be achieved using the above-described methods compared to applying a polymer for a top coating layer using actual immersion lithography equipment or by to an immersion lithography process using the same.

The polymer used for a top coating layer according to example embodiments includes a monomer having POSS molecules or derivatives thereof, and a comonomer having a functional group with polarity identical (or similar) to a hydroxy group and a carboxyl group. Because the polymer used has a stronger hydrophobicity, the polymer may not mix with water and a photoresist layer. The polymer may more easily dissolve in a developer. As such, the polymer may have greater commercial value. If the polymer is used in an immersion lithography process, then a more delicate and more accurate pattern may be achieved.

The foregoing is illustrative of example embodiments and is not to be construed as limiting thereof. Although a few example embodiments have been described, those skilled in the art will readily appreciate that many modifications are

What is claimed is:

1. A top coating layer, comprising:
a polymer having a chemical structure (1)

(1)

wherein $R_1$ represents a hydrogen or a methyl group; $R_2$ represents a cyclopentyl group; Y represents a propyl group; Z represents 2-hydroxyethyl methacrylate; the expressions m/(m+n)=0.1 to 0.7 and n/(m+n)=0.3 to 0.9 are satisfied; and a mass average molecular weight of the polymer is 5,000 to 100,000.

2. The top coating layer of claim 1, further comprising a solvent having 4 to 12 carbons, wherein the polymer has a percentage of solution by mass (mass %) of 1% to 10% of a total weight of the top coating layer.

3. A top coating composition, comprising:
polymer having a chemical structure (1)

(1)

wherein $R_1$ represents a hydrogen or a methyl group; $R_2$ represents at least one from the group consisting of a hydrogen, an alkyl group, an alkenyl group, an alkoxy group and an aryl group; Y represents a space group having 2 to 6 carbons; Z represents an ethylene monomer having at least one of a hydroxy group and a carboxyl group; the expressions m/(m+n)=0.1 to 0.7 and n/(m+n)=0.3 to 0.9 are satisfied; and a mass average molecular weight of the polymer is 5,000 to 100,000; and a solvent selected at least one from the group consisting of a 4-methyl-2-pentanol, isobutanol, isooctanol and decane, wherein the polymer has a percentage of solution by mass (mass %) of 1% to 10% of a total weight of the composition.

4. A top coating composition, comprising:
polymer having a chemical structure (1)

(1)

wherein $R_1$ represents a hydrogen or a methyl group; $R_2$ represents at least one from the group consisting of a hydrogen, an alkyl group, an alkenyl group, an alkoxy group and an aryl group; Y represents a space group having 2 to 6 carbons; Z represents an ethylene monomer having at least one of a hydroxy group and a carboxyl group; the expressions m/(m+n)=0.1 to 0.7 and n/(m+n)=0.3 to 0.9 are satisfied; and a mass average molecular weight of the polymer is 5,000 to 100,000; and a solvent having 4 to 12 carbons, wherein the solvent is a mixed solution including 95% of decane and 5% of an alcohol-series solvent, wherein the polymer has a percentage of solution by mass (mass %) of 1% to 10% of a total weight of the composition.

5. A top coating composition, comprising:
a solvent having 4 to 12 carbons; and
a polymer having chemical structure (1)

$R_1$ representing a hydrogen or a methyl group, $R_2$ representing a cyclopentyl group, Y representing a propyl group, Z represents 2-hydroxyethyl methacrylic acid, the expressions $m/(m+n)=0.1$ to 0.7 and $n/(m+n)=0.3$ to 0.9 being satisfied, a mass average molecular weight of the polymer being 5,000 to 100,000, and the polymer having a percentage of solution by mass (mass %) of 3% to 5% of the total weight of the composition.

6. An immersion lithography process, comprising:
forming a photoresist layer on a wafer;
forming a top coating layer on the photoresist layer, wherein the top coating layer includes a polymer having a chemical structure (1)

wherein $R_1$ represents a hydrogen or a methyl group; $R_2$ represents at least one selected from the group consisting of a hydrogen, an alkyl group, an alkenyl group, an alkoxy group, and an aryl group; Y represents a space group having 2 to 6 carbons; Z represents an ethylene monomer having at least one of a hydroxy group and a carboxyl group; the expressions $m/(m+n)=0.1$ to 0.7 and $n/(m+n)=0.3$ to 0.9 are satisfied; and a mass average molecular weight of the polymer is 5,000 to 100,000;
immersing the wafer in water;

performing an exposure process on the photoresist layer; and forming a photoresist pattern by removing the top coating layer and an unexposed portion of the photoresist layer or the exposed photoresist layer with a developer.

7. The immersion lithography process of claim 6, wherein forming the top coating layer includes:
coating the photoresist layer with a top coating composition including the polymer dissolved in a solvent having 4 to 12 carbons; and
performing a baking process on the coated photoresist layer,
wherein the polymer has a percentage of solution by mass (mass %) of 1% to 10% of a total weight of the composition.

8. The immersion lithography process of claim 7, wherein the solvent is at least one selected from the group consisting of 4-methyl-2-pentanol, isobutanol, isooctanol and decane.

9. The immersion lithography process of claim 7, wherein the solvent is a mixed solution including 95% of decane and 5% of an alcohol-series solvent.

10. The immersion lithography process of claim 7, wherein the mass % is 3% to 5% of the total weight of the composition.

11. The immersion lithography process of claim 6, wherein $R_2$, Y and Z represent a cyclopentyl group, a propyl group and methacrylic acid, respectively.

12. The immersion lithography process of claim 6, wherein $R_2$, Y and Z represent an isobutyl group, a propyl group and methacrylic acid, respectively.

13. The immersion lithography process of claim 6, wherein $R_2$, Y and Z represent a cyclopentyl group, a propyl group and 2-hydroxyethyl methacrylate, respectively.

14. The immersion lithography process of claim 6, wherein $R_2$, Y and Z represent a cyclopentyl group, a propyl group and methacrylic acid, respectively, and the polymer includes a comonomer formed of 2-hydroxyethyl methacrylate.

15. A polymer, comprising:
a chemical structure (1)

wherein $R_1$ represents a hydrogen or a methyl group; $R_2$ represents a cyclopentyl group; Y represents a propyl group; Z represents methacrylic acid; the expressions $m/(m+n)=0.1$ to 0.7 and $n/(m+n)=0.3$ to 0.9 are satisfied; and
a comonomer formed of 2-hydroxyethyl methacrylate, a mass average molecular weight of the polymer being 5,000 to 100,000.

* * * * *